United States Patent

Troyanovsky

[11] Patent Number: 5,808,915
[45] Date of Patent: Sep. 15, 1998

[54] METHOD FOR REDUCING THE MEMORY REQUIRED TO SIMULATING A CIRCUIT ON A DIGITAL COMPUTER

[75] Inventor: Boris Troyanovsky, San Francisco, Calif.

[73] Assignee: Hewlett-Packard Company, Palo Alto, Calif.

[21] Appl. No.: 746,357

[22] Filed: Nov. 8, 1996

[51] Int. Cl.$^6$ .................................................. G06F 11/00
[52] U.S. Cl. ........................................ 364/578; 395/500
[58] Field of Search .............................. 364/578, 488, 364/489, 490, 491; 395/500

[56] References Cited

U.S. PATENT DOCUMENTS

| | | | |
|---|---|---|---|
| 4,791,593 | 12/1988 | Hennion | 364/578 |
| 5,588,142 | 12/1996 | Sharrit | 395/500 |
| 5,666,367 | 9/1997 | Troyanovsky | 371/22.1 |

OTHER PUBLICATIONS

"Efficient Multi–Tone Distortion Analysis of Analog Integrated Circuits", by R. Melville, P. Feldmann, and J. Roychowdhury; Proceedings of the 1995 IEEE Custom Integrated Circuits Conference, May, 1995; pp. 241–244.

"Frequency Domain Continuation Method for the Analysis and Stability Investigation of Nonlinear Microwave Circuits" by D. Hente and R.H. Jansen; IEE Proceedings, vol. 133, Pt. H, No. 5, Oct. 1986; pp. 351–362.

*Primary Examiner*—Kevin J. Teska
*Assistant Examiner*—A. S. Roberts

[57] ABSTRACT

A method for simulating the response of a circuit to one or more stimulating signals using a digital computer. The circuit is represented by N nodes. Each node is connected to one or more devices. The nodes are held at a set of potentials represented by $$x_n(t) = \sum_{h=-H}^{H} X_{n,h} e^{j\omega_h t},$$

where $X_{n,-h} = X_{n,h}^*$, n runs from 1 to N, and H is an integer greater than 0. The method of the present invention determines the values of the $X_{n,h}$ by iteratively computing a new estimate for $X = [X_{10}, \ldots, X_{1H}, X_{20}, \ldots, X_{2H}, \ldots, X_{N0}, \ldots X_{NH}]$ from a previous estimate for X based on $F_{nh}$, for n from 1 to N and h from 0 to H. Here, $F_{nh}$ is the net current flowing into node n at frequency $\omega_h$. The net current at node n includes a non-linear resistive component $r_n(x(t))$ and a non-linear charge storage component $q_n(x(t))$, where $x(t)$ is a vector having components $x_n(t)$. The method of the present invention defines a set of mapped frequencies $\{\hat{\omega}_k\}$ wherein $0 \leq k \leq S-1$, $S \geq H+1$. There is a integer valued function $\mu(h)$ such that, $\omega_h$ is mapped to $\hat{\omega}_{\mu(h)}$, where $0 \leq \mu(h) \leq S-1$ for h=0 to H. Here, $\hat{\omega}_k$ is an integer, and $\hat{\omega}_k \neq \hat{\omega}_{k'}$ if k≠k'. The present invention iteratively solves the vector equation $F=[F_{10}, \ldots, F_{1H}, F_{20}, \ldots, F_{2H}, \ldots, F_{N0}, \ldots F_{NH}] = 0$. In each iteration, the quantities, $$^{\alpha\beta}\lambda_s = \frac{\partial r_\alpha(\hat{x}(t_s))}{\partial x_\beta} \text{ and } ^{\alpha\beta}\phi_s = \frac{\partial q_\alpha(\hat{x}(t_s))}{\partial x_\beta},$$

where $\alpha$ and $\beta$ run from 1 to N, for s=0 to 2S−1 are generated. The quantities ($^{\alpha\beta}\Lambda_0, ^{\alpha\beta}\Lambda_1, \ldots, ^{\alpha\beta}\Lambda_s$) are then generated from ($^{\alpha\beta}\lambda_0, ^{\alpha\beta}\lambda_1, \ldots, ^{\alpha\beta}\lambda_{2S-1}$) by taking the Fourier transform of ($^{\alpha\beta}\lambda_0, ^{\alpha\beta}\lambda_1, \ldots, ^{\alpha\beta}\lambda_{2S-1}$). Similarly, the quantities ($^{\alpha\beta}\Phi_0, ^{\alpha\beta}\Phi_1, \ldots, ^{\alpha\beta}\Phi_S$) are generated from ($^{\alpha\beta}\phi_0, ^{\alpha\beta}\phi_1, \ldots, ^{\alpha\beta}\phi_{2S-1}$) by taking the Fourier transform of ($^{\alpha\beta}\phi_0, ^{\alpha\beta}\phi_1, \ldots, ^{\alpha\beta}\phi_{2S-1}$). It can be shown that only a subset of $\{^{\alpha\beta}\Lambda_\xi\}$ and $\{^{\alpha\beta}\Phi_\xi\}$ need be stored.

8 Claims, 1 Drawing Sheet

METHOD FOR REDUCING THE MEMORY REQUIRED TO SIMULATING A CIRCUIT ON A DIGITAL COMPUTER

FIELD OF THE INVENTION

The present invention relates to computer programs for simulating electronic circuits on a computer, and more particularly, to a method for reducing the memory requirements imposed on the computer.

BACKGROUND OF THE INVENTION

The complexity of modem integrated circuits and the high cost of fabricating prototypes has led to the development of a class of computer programs that simulate the operation of a circuit. These simulators aid the designer in determining the proper bias voltages to be applied to the various components and in verifying the operation of the circuit before resources are committed to the fabrication of prototypes.

The circuit to be simulated is typically described in terms of a list of nodes and the components connected to each node. The user may actually provide a net list or a graphical representation of the circuit from which the program derives the net list. Each component may be viewed as a device that sources or sinks a current whose amplitude and phase are determined by the voltage at the node to which it is connected, and possibly, by the previous voltages at the node in question. The user may define particular components or utilize a library of standard components provided with the simulation program.

The simulation program finds the set of node voltages that lead to a circuit in which the sum of the currents at each node is zero. This is the voltage at which the currents provided by components that are the source of currents is exactly matched by the currents sinked by the remaining components. Each component is described by a subroutine that provides the current sinked or sourced by the component in response to an input voltage. As will be explained in more detail below, the component subroutines may also provide the first derivatives of the current with respect to the node voltages. In addition, the output of a component subroutine may depend on the history of the node to which the corresponding component is connected. For example, if the component contains inductors or capacitors, than the current will depend on the node voltage and the rate of change of the node voltage with time. The rate of change of the node voltage may be computed from the previous values of the node voltages, i.e., the "history of the nodes".

The simplest type of simulation determines the steady state behavior of the circuit, i.e., its DC operating conditions. Such simulations are particularly useful in setting various bias voltages on key nodes in the circuit. Under steady-state conditions, the solution of the simulation problem typically reduces to the inversion of an N×N sparse matrix, where N is the number of nodes in the circuit.

The simulation of the circuit under AC operating conditions is substantially more complex. Typically, the designer wishes to determine the voltage as a function of time at one or more nodes in the circuit when an input node is connected to a voltage source that varies with time. As noted above, one or more of the circuit components will sink or source currents whose amplitude and phase depend on the rate of change of the node voltage as well as the node voltage itself. Hence, the requirement that the currents entering a node are balanced by the currents leaving the node leads to system of differential equations. A circuit having N nodes is now described by an N×N system of differential equations.

Numerical methods for solving such systems of differential equations are known. These methods typically require an iterative process at each time point. Each iteration involves the inversion of an N×N matrix. Hence, the numerical difficulty of predicting the node voltages at any given time is many times greater than that of a simple DC simulation.

Furthermore, the solution must be repeated at each time point. The spacing of the time points is typically determined by the highest frequency expected at any node having a component connected thereto whose output depends on the rate of change of the node voltage, i.e., the first derivative of the node voltage. The first derivative is determined by fitting the current node voltage and one or previous node voltages to a curve. The slope of the curve is then used as an approximation to the first derivative. If successive time points are too far apart, the approximation will lead to a significant error in the first derivative. It should be noted that such an error is equivalent to making an error in an inductor or capacitor value in the circuit. Hence, simulations of transients will have an error that increase with the time step size. Thus, the required number of steps per second may be an order of magnitude higher than the highest frequency at the most sensitive node.

Consider a simulation in which the input signal to the circuit is a 10 kHz modulation of a 10 gHz microwave signal. To view the circuit response over 10 cycles of the modulation envelop, i.e., one millisecond, with a step size equal to one tenth the period of the carrier, the circuit behavior must be computed at 100 million time points. If the behavior at each of 1000 modes is to be recovered, the storage space for the results alone becomes a problem.

If the input wave form is periodic, the computational difficulty can be substantially reduced using harmonic balancing methods for computing the behavior of the circuit. In this case, the input signal may be written as a sum of sinusoids having fixed amplitudes. Each circuit component must provide the current sourced or sinked by that component in response to each of the sinusoids at the node connected to the component. If the input signal is represented by 10 sinusoids, the component must provide 10 current values plus the currents at harmonics of these values. It should be noted that each current is a complex number representing the current's amplitude and phase. The currents at the harmonics are needed because a non-linear device may excite one or more harmonics of an input signal. The simulation problem is then reduced to solving a set of non-linear equations in which the currents entering and leaving each node at each frequency are balanced.

The Harmonic Balance technique provides its advantages by eliminating the need to compute solutions at each time point. In this case, the solution of the (2H+1)N real non-linear equations provides the steady state solution to the simulation problem. Here, H is the number of harmonics for which each device must provide current data. The difficulty of solving the Harmonic Balance equations, however, limits the method to circuits and waveforms for which the solution of (2H+1)N non-linear equations can be accomplished.

The traditional approach to solving the Harmonic Balance equations utilizes the Newton-Raphson method for solving non-linear systems of equations. This system requires the solution of an (2H+1)N by (2H+1)N matrix which is normally accomplished by LU factorization. This method is not efficient for large systems of equations, since the memory required to factor the matrix rises as $O(N^\alpha H^2)$ and the computational workload rises as $O(N^\alpha H^3)$ where $1 \leq \alpha \leq 3$.

One method for reducing the computational workload for large systems of Harmonic Balance equations is known as the Krylov subspace method. This method replaces the problem of factoring the Jacobian matrix mentioned above by an iterative process involving multiplications of the Jacobian matrix with a vector that changes with each iteration. The computational workload for the Krylov method increases as $O(N^\alpha H \log H)$, while the memory storage rises as $O(H)$.

However, even with the computational advantages of the Krylov method, the memory needed to store a representation for the Jacobian matrix during the process dominates the memory requirements of the simulator. If the memory requirement exceeds the available RAM, the matrix representation must be moved to disk which results in an unacceptable increase in the processing time. Hence, the size of the circuit that can be simulated is limited by the memory requirements imposed by the need to store the Jacobian matrix.

Broadly, it is the object of the present invention to provide an improved method for simulating an electronic circuit on a computer.

It is a further object of the present invention to provide a simulator that requires less memory than prior art simulators.

These and other objects of the present invention will become apparent to those skilled in the art from the following detailed description of the invention and the accompanying drawings.

SUMMARY OF THE INVENTION

The present invention comprises a method for simulating the response of a circuit to one or more stimulating signals using a digital computer. The circuit is represented by N nodes, where N is an integer greater than 1. Each node is connected to one or more devices. The nodes are held at a set of potentials represented by $$x_n(t) = \sum_{h=-H}^{H} X_{n,h} e^{j\omega_h t},$$

where $X_{n,-h} = X_{n,h}^*$, runs from 1 to N, and H is an integer greater than 0. The method of the present invention determines the values of the $X_{n,h}$ by iteratively computing a new estimate for $X = [X_{10}, \ldots, X_{1H}, X_{20}, \ldots, X_{2H}, \ldots, X_{N0}, \ldots X_{NH}]$ from a previous estimate for X based on $F_{n,h}$, for n from 1 to N and h from 0 to H. Here, $F_{n,h}$ is the net current flowing into node n at frequency $\omega_h$. The net current at node n includes a non-linear resistive component $r_n(x(t))$ and a non-linear charge storage component $q_n(x(t))$, where x(t) is a vector having components $x_n(t)$. The method of the present invention defines a set of mapped frequencies $\{\hat{\omega}_k\}$ wherein $0 \leq k \leq S-1$, $S \geq H+1$. There is a integer valued function $\mu(h)$ such that $\omega_h$ is mapped to $\mu(h)$, where $0 \leq \mu(h) \leq S-1$ for $h=0$ to H. Here, $\hat{\omega}_k$ is an integer, and $\hat{\omega}_k \neq \hat{\omega}_{k'}$ if $k \neq k'$. The maximum value of $\{\hat{\omega}_k\}$ is less than the maximum value of $\{\omega_k\}$ divided by the greatest common denominator of all the non-zero $\{\omega_k\}$. The present invention defines a starting value for X; and then determines the value of X for which $F = [F_{10}, \ldots, F_{1H}, F_{20}, \ldots, F_{2H}, \ldots, F_{N0}, \ldots F_{NH}]$ is 0 in an iterative procedure. In each iteration, the quantities, $$^{\alpha\beta}\lambda_s = \frac{\partial r_\alpha(\hat{x}(t_s))}{\partial x_\beta} \text{ and } ^{\alpha\beta}\phi_s = \frac{\partial q_\alpha(\hat{x}(t_s))}{\partial x_\beta},$$

where $\alpha$ and $\beta$ run from 1 to N, for s=0 to 2S-1 are generated. The quantities $(^{\alpha\beta}\Lambda_0, {}^{\alpha\beta}\Lambda_1, \ldots, {}^{\alpha\beta}\Lambda_s)$ are then generated from $(^{\alpha\beta}\lambda_0, {}^{\alpha\beta}\lambda_1, \ldots, {}^{\alpha\beta}\lambda_{2S-1})$ by taking the Fourier transform of $(^{\alpha\beta}\lambda_0, {}^{\alpha\beta}\lambda_1, \ldots, {}^{\alpha\beta}\lambda_{2S-1})$. Similarly, the quantities $(^{\alpha\beta}\Phi_0, {}^{\alpha\beta}\Phi_1, \ldots, {}^{\alpha\beta}\Phi_s)$ are generated from $(^{\alpha\beta}\phi_0, {}^{\alpha\beta}\phi_1, \ldots, {}^{\alpha\beta}\phi_{2S-1})$ by taking the Fourier transform of $(^{\alpha\beta}\phi_0, {}^{\alpha\beta}\phi_1, \ldots, {}^{\alpha\beta}\phi_{2S-1})$. The quantities $\{^{\alpha\beta}\Lambda_\xi | \xi = \mu(m) + \mu(n) \text{ or } \xi = |\mu(m) - \mu(n)| \text{ or } \xi = 2S - \mu(m) - \mu(n), \xi \leq S, \text{ for } 0 \leq m, n \leq H\}$ and $\{^{\alpha\beta}\Phi_\xi | \xi = \mu(m) + \mu(n) \text{ or } \xi = |\mu(m) - \mu(n)| \text{ or } \xi = 2S - \mu(m) - \mu(n), \xi \leq S, \text{ for } 0 \leq m, n \leq H\}$ are stored in the computer and the stored values are utilized to compute the product of a Jacobian matrix of F times a vector. Here, $$\hat{x}_n(t) = \sum_{h=-H}^{H} X_{n,h} e^{j\omega\mu(h)t}.$$

DETAILED DESCRIPTION OF THE PREFERRED EMBODIMENTS OF THE INVENTION

Figure 1:
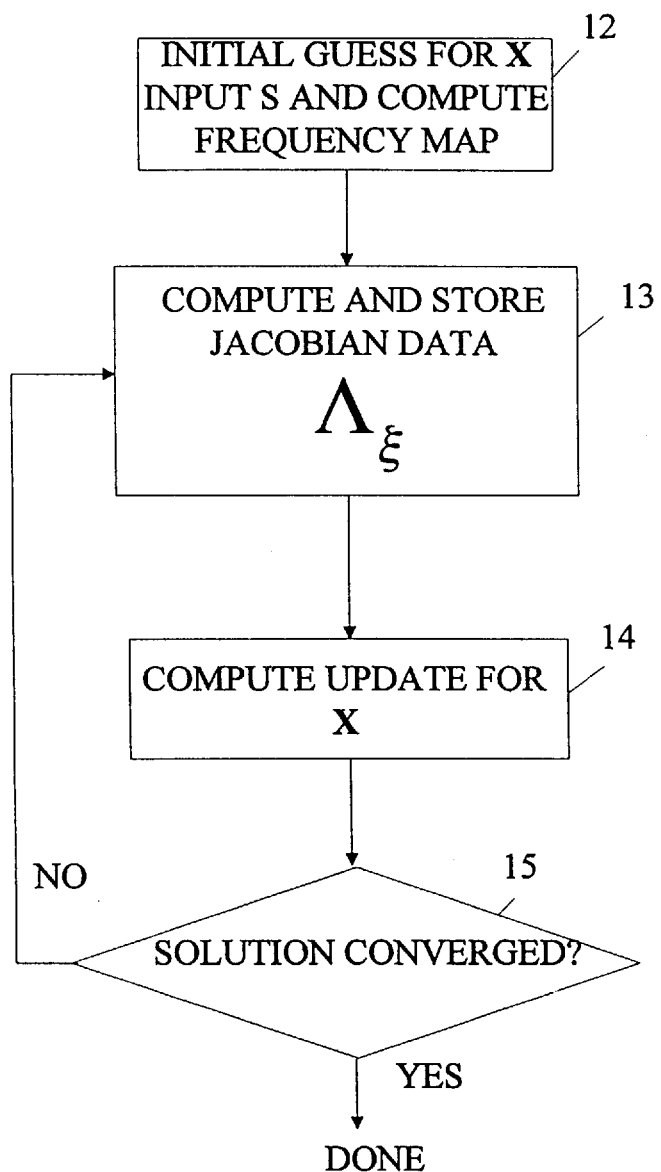
FIG. 1 is a flow chart for the basic iteration process used in the present invention.

The present invention may be more easily discussed with the aid of vector notation. Vector quantities will be denoted by bold type in the following discussion. Unless otherwise indicated, a vector will be assumed to have one component associated with each of the circuit nodes. For example, each circuit node may be connected to a current source which provides a current $w_n(t)$ to the $n^{th}$ current node. The vector w(t) denotes $[w_1(t), w_2(t), \ldots, w_N(t)]$. In terms of this notation, the current balancing equations that describe the circuit may be written in the form $$r(x(t)) + d/dt\, q(x(t)) + y(t) \otimes x(t) - w(t) = 0 \qquad (1)$$

Here, x(t) is the voltage as a function of time at the N nodes, r is the non-linear resistive currents at the N nodes, and q is the non-linear charge functions at the N nodes. The effects of the linear circuit elements have been combined into a matrix y(t) of impulse responses.

The Harmonic Balance method replaces various arbitrary time functions by quasi-Fourier series of the form $$x(t) = \sum_{h=-H}^{H} X_h e^{j\omega_h t} \qquad (2)$$

where $X_{n,-h} = X_{n,h}^*$, H is the total number of harmonics assumed to be present. Similarly, $$r(x(t)) = \sum_{h=-H}^{H} R_h e^{j\omega_h t} \qquad (3)$$

$$q(x(t)) = \sum_{h=-H}^{H} Q_h e^{j\omega_h t} \qquad (4)$$

and $$w(t) = \sum_{h=-H}^{H} W_h e^{j\omega_h t} \qquad (5)$$

If the relationships shown in Eqs. (2)–(5) are substituted into Eq. (1), Eq. (1) can be rewritten as a set of H+1 vector equations of the form $$F_h(X_1, \ldots, X_N) = R_h(X_1, \ldots, X_N) + j\omega_h Q_h(X_1, \ldots, X_N) + Y_h \cdot X_h - W_h = 0 \text{ for } 0 \leq h \leq H \qquad (6)$$

Where Y is a matrix representing the linear devices in the frequency domain. $Y_h$ is the hth component of the Fourier transform of y(t). The matrix Y may be obtained from the Fourier transform of y(t).

The circuit simulation problem may be restated as the problem of finding the values of the vectors $X_h$ for which $F_h(X_1, \ldots, X_N)=0$ for all values of h. To further simplify the following discussion, define $$F=[F_{10}, \ldots, F_{1H}, F_{20}, \ldots, F_{2H}, \ldots, F_{N0}, \ldots F_{NH}] \tag{7}$$

and $$X=[X_{10}, \ldots, X_{1H}, X_{20}, \ldots, X_{2H}, \ldots, X_{N0}, \ldots X_{NH}] \tag{8}$$

Given an estimate of X, $^iX$, a new estimate for X, denoted by $^{i+1}X$ may be obtained using the Newton-Raphson method $$^{i+1}X = {^iX} - {^i}\left(\frac{\partial F}{\partial X}\right)^{-1_i} F \tag{9}$$

where

Here, $(\partial F/\partial X)^{-1}$ denotes the inverse of the Jacobian matrix. Because both F and X are vectors of complex quantities, the Jacobian elements are 2×2 matrices of the form $$\begin{bmatrix} \dfrac{\partial F_{nh,re}}{\partial X_{kj,re}} & \dfrac{\partial F_{nh,re}}{\partial X_{kj,im}} \\ \dfrac{\partial F_{nh,im}}{\partial X_{kj,re}} & \dfrac{\partial F_{nh,im}}{\partial X_{kj,im}} \end{bmatrix} \tag{10}$$

Here, $F_{nh,re}$ and $F_{nh,im}$ are the real and imaginary parts of $F_{nh}$, respectively. Similarly $X_{kj,re}$ and $X_{kj,im}$ are the real and imaginary parts of $X_{kj}$, respectively. As noted above, for large problems, the solution to the problem described by Eq. (10) is best performed through the iterative Krylov-subspace based algorithms. Since these methods are well known to those skilled in the art, they will not be discussed in detail here. The reader is referred to R. Melville, P. Feldmann, and J. Roychowdhury, "Efficient Multi-Tone Distortion Analysis of Analog Integrated Circuits", *Proceedings of the 1995 IEEE Custom Integrated Circuits Conference*, May, 1995, which is hereby incorporated by reference, for a more detailed description of the methods. For the purposes of the present discussion, it is sufficient to note that these algorithms are all based on computing the vector obtained by multiplying the Jacobian by a vector that changes at each iteration.

To carry out the iteration represented by Eq. (9), the Jacobian must be computed for each new value of X. In addition, a compact representation of the Jacobian must be stored in some form in the memory of the computer so that the various matrix-vector multiplications can be performed. It will be appreciated that the memory required to store a representation of the Jacobian can be very large. The present invention provides a method for efficiently computing and storing the Jacobian matrix.

Given a value for X, the computer must compute the vectors $R_h$ and $Q_h$, and the computer must compute the various first derivatives of these vectors. In principle, $R_h$ and $Q_h$ be obtained from the Fourier transform of r(x(t)) and q(x(t)). The computational workload inherent in this computation may be substantially reduced if the transforms can be computed using FFT or DFT methods. In addition, using FFT/DFT methods improves the accuracy of the solution. However, to apply such methods, the set of frequencies, $\{\omega_h\}$ must be harmonically related or artificially remapped to be harmonically related as described below.

The choice of frequencies are selected in the present invention based on a harmonic truncation and re-mapping scheme to reduce the computational workload and memory needed to compute the Fourier transforms. Consider the case in which the various excitation sources have frequencies $\Omega_1, \Omega_2, \ldots, \Omega_M$. Here, M is a positive integer. In general, the set of frequencies $\{\omega_h\}$ will be chosen from the set of frequencies that may be represented in the form $(k_1\Omega_1 + k_2\Omega_2 + \ldots + k_M\Omega_M)$. In general, these frequencies are not harmonically related, i.e., there is no frequency $\omega_0$ for which $$\omega_h = k_h \omega_0 \tag{11}$$

for all values of h, where $k_h$ is an integer. In addition, even if Eq. (11) were satisfied, the range of frequencies represented by $\{\omega_h\}$ may be too large. For example, the computation of the Fourier transform of r(x(t)) at frequency $\omega_h$ requires, in effect, an integration of the form $$R_h = \int_{-\infty}^{\infty} r(x(t))e^{j\omega_h t} dt \tag{12}$$

The number of sample points required to perform this integration depends on the range of frequencies in $\{\omega_h\}$. In the case in which the frequencies are harmonically related, Eq. (12) can by replaced by a FFT or DFT applied to a vector consisting of the sampled time values, i.e., $$R_h = [\Gamma r(X)]_h, \tag{13}$$

where $$r(x) = \begin{bmatrix} r(x(t_0)) \\ \cdot \\ \cdot \\ \cdot \\ r(x(t_{2S'-1})) \end{bmatrix} \tag{14}$$

However, the number of samples needed, i.e., the value of S', depends on the range of frequencies in the set $\{\omega_h\}$.

Hence, it is advantageous to transform the problem to a new frequency space for the purposes of computing the Fourier transforms needed to obtain $R_h$ and $Q_h$. The transformation replaces each $\omega_h$ by a new frequency $\hat{\omega}_h$ such that the frequencies $\hat{\omega}_h$ are harmonically related, the maximum value of $\{\hat{\omega}_h\}$ is less than the maximum value $\{\omega_k\}$ divided by the greatest common denominator of all the non-zero $\{\omega_k\}$, and the coefficients $R_h$, and $Q_h$ are the same as those computed above for the original frequency set. That is, $$\hat{x}(t) = \sum_{h=-H}^{H} X_h e^{j\hat{\omega}_{\mu(h)} t} \tag{15}$$

$$R(\hat{x}(t)) = \sum_{h=-H}^{H} R_h e^{j\hat{\omega}_{\mu(h)} t} \tag{16}$$

and $$Q(\hat{x}(t)) = \sum_{h=-H}^{H} Q_h e^{j\hat{\omega}_{\mu(h)} t} \tag{17}$$

where $\mu(h)$ is the mapping from the original frequency set to the new frequency set. In general, $\hat{\omega}_{\mu(h)}$ is an integer multiple of $\mu(h)$. For simplicity, the following discussion will assume that $\hat{\omega}_{\mu(h)} = \mu(h)$. The number of frequencies, S, in the new frequency set will depend on the number of samples used in the FFT to compute $R_h$ and $Q_h$. S will often be greater than H+1 to provide increased computational accuracy. The methods for performing this type of mapping are known to those skilled in the art, and hence, will not be discussed in detail here. The reader is referred to D. Hente and R. H. Jansen, "Frequency Domain Continuation Method for the Analysis and Stability Investigation of Nonlinear Microwave Circuits", *IEEE Proceedings, part H, volume* 133, no.

5, October 1986, pp. 351–362, for a detailed description of the mapping methods. For the purposes of the present discussion, it is sufficient to note that each fundamental frequency $\Omega_m$ is replaced by an integer-valued remap frequency $\hat{\Omega}_m$ such that $$\hat{\omega}_k = k_1\hat{\Omega}_1 + k_2\hat{\Omega}_2 + \ldots + k_M\hat{\Omega}_M$$

and $\omega_h$ is mapped to one, and only one, of the $\{\hat{\omega}_k\}$ for each value of h. That is, $\omega_h$ is mapped to $\hat{\omega}_{\mu(h)}$, where $\mu(h)$ is an integer valued function. Here, $0 \leq \mu S - 1$.

For circuit elements that have algebraic nonlinearities, the Fourier transform of $r(x(t))$ and $q(x(t))$ can be computed from the Fourier transforms of $r(\hat{x}(t))$ and $q(\hat{x}(t))$. Assume that the non-linearities are measured by sampling the circuit elements at 2S time points in the time-domain. Then it can be shown that $$R_h = [\Gamma r(\hat{x})]_{\mu(h)}, \text{ where } r(\hat{x}) = \begin{bmatrix} r(\hat{x}(t_0)) \\ \vdots \\ r(\hat{x}(t_{2S-1})) \end{bmatrix} \quad (18)$$

$$Q_h = [\Gamma q(\hat{x})]_{\mu(h)}, \text{ where } q(\hat{x}) = \begin{bmatrix} q(\hat{x}(t_0)) \\ \vdots \\ q(\hat{x}(t_{2S-1})) \end{bmatrix} \quad (19)$$

and $$Y = \Gamma(y(t_1), y(t_2), \ldots, y(t_{2S-1})) \quad (20)$$

Here, $\Gamma$ and $\Gamma^{-1}$ denote the single-sided forward and backward Discrete Fourier Transform matrices. Since the new frequency space has a smaller range of frequency values, S will be significantly less than S' shown in Eq. (14).

The Jacobian matrix consists of a sparse N×N collection of square blocks, denoted by $^{\alpha\beta}J_{mn}$. Consider the case in which the block corresponds to a resistive nonlinearity, i.e., the corresponding node has only a resistive nonlinearity. Define $$^{\alpha\beta}\lambda_s = \frac{\partial r_\alpha(t_s)}{\partial x_\beta} \quad (21)$$

where $\alpha$ and $\beta$ run from 1 to N. Define $(^{\alpha\beta}\Lambda_0, {}^{\alpha\beta}\Lambda_1, \ldots, {}^{\alpha\beta}\Lambda_s)$ to be the 2S-point, single sided Discrete Fourier Transform of the $(^{\alpha\beta}\lambda_0, {}^{\alpha\beta}\lambda_1, \ldots, {}^{\alpha\beta}\lambda_{2S-1'})$. Then it can be shown that the (H+1)×(H+1) Jacobian blocks consist of 2×2 quads having the form $$^{\alpha\beta}j_{mn} = t^{\alpha\beta}\mu(m) - \mu(n) + w^{\alpha\beta}\mu(m) + \mu(n), \quad (22)$$

where $$t_k^{\alpha\beta} = \begin{bmatrix} {}^{\alpha\beta}\Lambda_k^R & -{}^{\alpha\beta}\Lambda_k^I \\ {}^{\alpha\beta}\Lambda_k^I & {}^{\alpha\beta}\Lambda_k^R \end{bmatrix} \quad (23)$$

and $$w_k^{\alpha\beta} = \begin{bmatrix} {}^{\alpha\beta}\Lambda_k^R & {}^{\alpha\beta}\Lambda_k^I \\ {}^{\alpha\beta}\Lambda_k^I & -{}^{\alpha\beta}\Lambda_k^R \end{bmatrix} \quad (24)$$

where $0 \leq m, n \leq H$ and $\mu$ is the mapping described above.

For a capacitive non-linearity, define $$^{\alpha\beta}\phi_s = \frac{\partial q_\alpha(t_s)}{\partial x_\beta} \quad (25)$$

where $\alpha$ and $\beta$ run from 1 to N and $x=[X_1, \ldots, X_N]$. Define $(^{\alpha\beta}\Phi_0, {}^{\alpha\beta}\Phi_1, \ldots, {}^{\alpha\beta}\Phi_S)$ to be the 2S-point, single sided Discrete Fourier Transform of the $(^{\alpha\beta}\phi_0, {}^{\alpha\beta}\phi_1, \ldots, {}^{\alpha\beta}\phi_{2S-1})$. In addition, a nonlinear capacitive block requires an additional multiplication on the left by a diagonal matrix of H+1 quads. That is, for a nonlinear capacitive block, $$t_k^{\alpha\beta} = \begin{bmatrix} 0 & -\omega_m \\ \omega_m & 0 \end{bmatrix} \begin{bmatrix} {}^{\alpha\beta}\Phi_k^R & -{}^{\alpha\beta}\Phi_k^I \\ {}^{\alpha\beta}\Phi_k^I & {}^{\alpha\beta}\Phi_k^R \end{bmatrix} \quad (26)$$

and $$w_k^{\alpha\beta} = \begin{bmatrix} 0 & -\omega_m \\ \omega_m & 0 \end{bmatrix} \begin{bmatrix} {}^{\alpha\beta}\Phi_k^R & {}^{\alpha\beta}\Phi_k^I \\ {}^{\alpha\beta}\Phi_k^I & -{}^{\alpha\beta}\Phi_k^R \end{bmatrix} \quad (27)$$

if a node has both resistive and capacitive nonlinear terms, than the $t^{\alpha\beta}k$ are the sum of the terms shown in Eqs. (23) and (26). Similarly, $w^{\alpha\beta}k$ is the sum of the terms shown in Eqs. (24) and (27).

In general, S is larger than H. This results from the need to over sample to provide sufficient accuracy in the computation of $R_h$ and $Q_h$, the mapping between the original frequency set and the frequency set used to compute $R_h$ and $Q_h$. In addition, S must be increased to the nearest power of 2 to allow the application of the FFT methods. It should be noted that the minimum value of S is $\hat{\omega}_{max}$, i.e, the maximum used frequency in the transformed frequency space.

The present invention provides a method for carrying out the multiplications of the Jacobian times the vectors in the Krylov iteration without the need to store all of the $^{\alpha\beta}\Lambda_k$ values. Consider the product of the Jacobian with a vector, v. The vector v has length NH and may viewed as a sequence N smaller complex vectors of length H, i.e., $$v = [{}^1v, {}^2v, \ldots, {}^Nv] \quad (28)$$

The product of v and the Jacobian may be written as $$[Jv]_\alpha = \sum_{\beta=1}^{N} {}^{\alpha\beta}J {}^\beta v \quad (29)$$

$$[{}^{\alpha\beta}J {}^\beta v]_m = \sum_{n,\beta} \{{}^\beta v_n {}^{\alpha\beta}\Lambda_{\mu(m)-\mu(n)} + {}^\beta v_n^* {}^{\alpha\beta}\Lambda_{\mu(m)+\mu(n)} + \quad (30)$$

$$j\omega_m({}^\beta v_n {}^{\alpha\beta}\Phi_{\mu(m)-\mu(n)} + {}^\beta v_n^* {}^{\alpha\beta}\Phi_{\mu(m)+\mu(n)})\}$$

where $$\Lambda_{-k} = \Lambda^*_k, \; \Phi_{-k} = \Phi^*_k, \; \Lambda_{S+k} = \Lambda^*_{S-k}, \; \Phi_{S+k} = \Phi^*_{S-k} \text{ for } 0 \leq k \leq S-1.$$

Hence, the product of the Jacobian times a vector requires only a subset of the $^{\alpha\beta}\Lambda$ values. It can be seen from Eq. (30) that only $$\{{}^{\alpha\beta}\Lambda_\xi | \xi = \mu(m) + \mu(n) \text{ or } \xi = |\mu(m) - \mu(n)| \text{ or } \xi = 2S - \mu(m) - \mu(n), \; \xi \leq S, \text{ for } 0 \leq m, n \leq H\} \quad (31a)$$

and $$\{{}^{\alpha\beta}\Phi_\xi | \xi = \mu(m) + \mu(n) \text{ or } \xi = |\mu(m) - \mu(n)| \text{ or } \xi = 2S - \mu(m) - \mu(n), \; \xi \leq S, \text{ for } 0 \leq m, n \leq H\} \quad (31b)$$

needs to be stored. The storage savings, however, requires some alterations in the above described procedures. The optimum approach depends on the specific circuit being simulated. Denote the number of entries in the set shown in Eq. (31) by L. If L<<logS for all entries in block-row $\alpha$, the matrix-vector products are computed using Eq. (30).

Alternatively, the matrix-vector products can be computed in O(SlogS) by using an extra FFT to "unpack" the stored values. To simplify the discussion, the case in which only resistive non-linearities are present will be discussed below. It will be apparent to those skilled in the art from the following discussion that the same method may be employed to unpack the capacitive terms. The unpacking is accomplished by computing a set of vectors $^\beta p$ according to $$^\beta p_s = \begin{cases} ^\beta v_h, & \text{if there is an } h \text{ such that } s = \mu(h) \\ 0, & \text{otherwise} \end{cases} \quad (32)$$

The packed data shown in Eq. (31) is then used to generate an array $(^{\alpha\beta}\overline{\Lambda}_0, ^{\alpha\beta}\overline{\Lambda}_1, \ldots, ^{\alpha\beta}\overline{\Lambda}_s)$ according to $$^{\alpha\beta}\overline{\Lambda}_s = \begin{cases} ^{\alpha\beta}\Lambda_s, & \text{if } ^{\alpha\beta}\Lambda_s \text{ is in the set (31a)} \\ 0, & \text{otherwise} \end{cases} \quad (33)$$

The array $(^{\alpha\beta}\overline{\Lambda}_0, ^{\alpha\beta}\overline{\Lambda}_1, \ldots, ^{\alpha\beta}\overline{\Lambda}_s)$ is then transformed using a single-sided inverse FFT to obtain the corresponding time-domain samples $(^{\alpha\beta}\overline{\lambda}_0, ^{\alpha\beta}\overline{\lambda}_1, \ldots, ^{\alpha\beta}\overline{\lambda}_{2S-1})$. The Jacobian-vector products are then computed via an FFT, according to $$[^{\alpha\beta}J^\beta v]_m = [\Gamma^{\alpha\beta}\overline{D}\Gamma^{-\beta}p]_{\mu(m)} \quad (34)$$

where, $$^{\alpha\beta}\overline{D} = \begin{bmatrix} ^{\alpha\beta}\overline{\lambda}_0 & 0 & \ldots & 0 \\ 0 & ^{\alpha\beta}\overline{\lambda}_1 & \ldots & 0 \\ \cdot & \cdot & \cdot & \cdot \\ \cdot & \cdot & \cdot & \cdot \\ 0 & 0 & \ldots & ^{\alpha\beta}\overline{\lambda}_{2S-1} \end{bmatrix} \quad (35)$$

If capacitive non-linearities are also present, define $$^{\alpha\beta}\overline{\Phi}_s = \begin{cases} ^{\alpha\beta}\Phi_s, & \text{if } ^{\alpha\beta}\Phi_s \text{ is in the set (31b)} \\ 0, & \text{otherwise} \end{cases} \quad (36)$$

The array $(^{\alpha\beta}\overline{\Phi}_0, ^{\alpha\beta}\overline{\Phi}_1, \ldots, ^{\alpha\beta}\overline{\Phi}_s)$ is then transformed using a single-sided inverse FFT to obtain the corresponding time-domain samples $(^{\alpha\beta}\overline{\phi}_0, ^{\alpha\beta}\overline{\phi}_1, \ldots, ^{\alpha\beta}\overline{\phi}_{2S-1})$ which are used to define a diagonal matrix $$^{\alpha\beta}D_C = \begin{bmatrix} ^{\alpha\beta}\overline{\phi}_0 & 0 & \ldots & 0 \\ 0 & ^{\alpha\beta}\overline{\phi}_1 & \ldots & 0 \\ \cdot & \cdot & \cdot & \cdot \\ \cdot & \cdot & \cdot & \cdot \\ 0 & 0 & \ldots & ^{\alpha\beta}\overline{\phi}_{2S-1} \end{bmatrix} \quad (37)$$

The Jacobian vector products are then computed as follows:

$$[^{\alpha\beta}J^\beta v]_m = [\Gamma^{\alpha\beta}\overline{D}\Gamma^{-1\beta}p]_{\mu(m)} + j\omega_m[\Gamma^{\alpha\beta}\overline{D}_C\Gamma^{-1\beta}p]_{\mu(m)} \quad (38)$$

The product for row $\alpha$ requires only 2S multiplies for each resistive nonlinear block in row $\alpha$ followed by additions and an FFT. Similarly, 2S multiplies are required for each capacitive block, followed by additions, an FFT, and multiplication by $\{j\omega\}$; hence, the computational workload is O(SlogS). The cost of the inverse FFT is only incurred once for all blocks of the Jacobian associated with the same circuit node. The determination of which method to use is made at run-time depending on the values of S and L. It should be noted that both of these methods are exact.

The memory associated with the storage of the packed Jacobian spectral samples given in Eqs. (31a) and (31b) typically dominates all other memory usage by the simulator. For very large problems, it may be necessary to further reduce memory usage. This can be accomplished in the present invention by using approximations for the spectrum. This leads to an approximation for the Jacobian.

Two techniques may be used to approximate the spectrum, thereby reducing the memory requirements. In the first technique, referred to as "bandwidth limitation", each of the blocks is assigned a maximum bandwidth and only those spectral samples for which $\xi \leq_{max}$ are stored. The remaining samples are assumed to be zero. The bandwidth parameter is chosen such that the excluded samples have amplitudes below a predetermined threshold value.

In the second technique, only those spectral samples having amplitudes above a predetermined threshold are stored. While this technique requires fewer spectral samples to be stored, a separate storage array specifying which samples are stored must be allocated. The choice between these two techniques is made at run-time when the data needed to determine which technique requires the smaller storage is available.

The procedure for finding the value of X that solves the current equations shown in Eq. (6) is shown in flow chart form in FIG. 1. The value of S to be used in the frequency mapping is input to the solver and the frequency mapping determined as shown at 12. An initial guess for X is also input. Given a value for X and the frequency mapping, the values for the $\Lambda_\xi$ shown in Eq. (26) are computed and stored as shown at 13. The stored values are then used to compute the updated value for X using the Krylov method as shown at 14. If the values of X have converged as shown at 15, the process is terminated. If not, a new set of values for the $\Lambda_\xi$ and the process repeated.

Various modifications to the present invention will become apparent to those skilled in the art from the foregoing description and accompanying drawings. Accordingly, the present invention is to be limited solely by the scope of the following claims.

What is claimed is:

1. A computer readable storage medium for storing a program which when processed by a digital computer causes a reduction in the usage of memory in said digital computer used to simulate the response of a circuit to one or more stimulating signals, said circuit being represented by N nodes, where N is an integer greater than 1, each node being connected to one or more devices that act as a source of current for that node, said nodes being held at a set of potentials represented by $$x_n(t) = \sum_{h=-H}^{H} X_{n,h} e^{j\omega_h t},$$

where $X_{n,-h} = X_{n,h}^*$, n runs from 1 to N, and H is an integer greater 0, said program determining values for said $X_{n,h}$ by iteratively computing a new estimate for $X = (X_{10}, \ldots, X_{1H}, X_{20}, \ldots, X_{2H}, \ldots, X_{N0}, \ldots X_{NH})$ from a previous estimate for X based on $F_{nh}$, for n from 1 to N and h from 0 to H, wherein $F_{nh}$ is the net current flowing into node n at frequency $\omega_h$, said net current comprising a non-linear resistive component $r_n(x(t))$ and a non-linear charge storage component $q_n(x(t))$, where x(t) is a vector having components $x_n(t)$, said program comprising steps of:

defining a set of mapped frequencies $\{\hat{\omega}_k\}$ wherein $0 \leq k \leq S$, $S \geq H$, there being an integer valued function, $\mu(h)$, such that $0 \leq \mu(h) \leq S$ and $\omega_h$ is mapped to $\hat{\omega}_{\mu(h)}$, wherein $\hat{\omega}_k$ is an integer and $\hat{\omega}_k \neq \hat{\omega}_{k'}$ if k≠k';

defining a starting value for X; and determining said value of X for which $F = (F_{10}, \ldots, F_{1H}, F_{20} \ldots, F_{2H}, \ldots, F_{N0}, \ldots F_{NH})$ is 0 in an iterative procedure, each iteration comprising the steps of:

generating the quantities $$\alpha\beta\lambda_s = \frac{\partial r_\beta(\hat{x}(t_s))}{\partial x_\beta},$$

where $\alpha$ and $\beta$ run from 1 to N, and s runs from 0 to 2S−1;

generating the quantities ($^{\alpha\beta}\Lambda_0$, $^{\alpha\beta}\Lambda_1$, ..., $^{\alpha\beta}\Lambda_{s-1}$) from ($^{\alpha\beta}\lambda_0$, $^{\alpha\beta}\lambda_1$, ..., $^{\alpha\beta}\lambda_{2S-1}$) by taking said Fourier transform of ($^{\alpha\beta}\lambda_0$, $^{\alpha\beta}\lambda_1$, ..., $^{\alpha\beta}\lambda_{2S-1}$), and storing in said memory the set of values $\{^{\alpha\beta}\Lambda_\xi | \xi=\mu(m)+\mu(n)$ or $\xi=|\mu(m)-\mu(n)|$, for $0 \leq m,n \leq H\}$;

and utilizing said stored values to compute a product of a Jacobian matrix of F times a vector, wherein $$\hat{x}_n(t) = \sum_{h=-S}^{S} X_{n,h} e^{j m \mu(h) t},$$

and wherein there is at least one value of $^{\alpha\beta}\Lambda_\xi$ such that $\xi \neq \mu(m)+\mu(n)$ and $\xi \neq |\mu(m)-\mu(n)|$, for $0 \leq m,n \leq H$ which is not stored in said memory during said iteration.

2. The medium of claim 1 wherein said step of computing said product of said Jacobian further comprises the steps of defining ($^{\alpha\beta}\overline{\Lambda}_0$, $^{\alpha\beta}\overline{\Lambda}_1$, ..., $^{\alpha\beta}\overline{\Lambda}_{S-1}$) according to $$^{\alpha\beta}\overline{\Lambda}_s = \begin{cases} ^{\alpha\beta}\Lambda_h, \text{ if there is an } h \text{ such that } s = \mu(h) \\ 0, \text{ otherwise} \end{cases}$$

and transforming ($^{\alpha\beta}\overline{\Lambda}_0$, $^{\alpha\beta}\overline{\Lambda}_1$, ..., $^{\alpha\beta}\overline{\Lambda}_{S-1}$) utilizing a single-sided inverse FFT.

3. The medium of claim 1 wherein, for at least one of said iterations, said values of $^{\alpha\beta}\Lambda_\xi$ are approximated by 0 for $\xi \leq \xi_{max}$, $\xi_{max}$ being less than said maximum value of $\xi$ for which $\xi=\mu(m)+\mu(n)$ or $\xi=|\mu(m)-\mu(n)|$.

4. The medium of claim 1 wherein $^{\alpha\beta}\Lambda_\xi$ is approximated by 0 if the absolute value of $^{\alpha\beta}\Lambda_\xi$ is less than a threshold value.

5. The medium of claim 1 further comprising the steps of generating the quantities $$\alpha\beta\phi_s = \frac{\partial q_\alpha(t_s)}{\partial x_\beta},$$

where $\alpha$ and $\beta$ run from 1 to N, and s runs from 0 to 2S−1;

generating the quantities ($^{\alpha\beta}\Phi_0$, $^{\alpha\beta}\Phi_1$, ..., $^{\alpha\beta}\Phi_{S-1}$) from ($^{\alpha\beta}\phi_0$, $^{\alpha\beta}\phi_1$, ..., $^{\alpha\beta}\phi_{2S-1}$) by taking said Fourier transform of ($^{\alpha\beta}\phi_0$, $^{\alpha\beta}\phi_1$, ..., $^{\alpha\beta}\phi_{2S-1}$), and storing in said memory the set of values $\{^{\alpha\beta}\Lambda_\xi | \xi=\mu(m)+\mu(n)$ or $\xi=|\mu(m)-\mu(n)|$, for $0 \leq m,n \leq H\}$;

and utilizing said stored values to compute a product of said Jacobian matrix of F times a vector, wherein there is at least one value of $^{\alpha\beta}\Phi_\xi$ such that $\xi \neq \mu(m)+\mu(n)$ and $\xi \neq \mu(m)-\mu(n)$, for $0 \leq m,n \leq H$ which is not stored in said computer during said iteration.

6. The medium of claim 5 wherein said step of computing said product of said Jacobian further comprises the steps of defining an array ($^{\alpha\beta}\Phi_0$, $^{\alpha\beta}\Phi_1$, ..., $^{\alpha\beta}\Phi_{S-1}$) according to $$^{\alpha\beta}\overline{\Phi}_s = \begin{cases} ^{\alpha\beta}\Phi_h, \text{ if there is an } h \text{ such that } s = \mu(h) \\ 0, \text{ otherwise} \end{cases}$$

transforming ($^{\alpha\beta}\Phi_0$, $^{\alpha\beta}\Phi_1$, ..., $^{\alpha\beta}\Phi_{S-1}$) via a single sided inverse Fourier transform.

7. The medium of claim 5 wherein, for at least one of said iterations, said values of $^{\alpha\beta}\Phi_\xi$ are approximated by 0 for $\xi \leq \xi_{max}$, $\xi_{max}$ being less than said maximum value of $\xi$ for which $\xi=\mu(m)+\mu(n)$ or $\xi=|\mu(m)-\mu(n)|$.

8. The medium of claim 5 wherein $^{\alpha\beta}\Phi_\xi$ is approximated by 0 if the absolute value of $^{\alpha\beta}\Phi_\xi$ is less than a threshold value.

\* \* \* \* \*